(12) United States Patent
Wang et al.

(10) Patent No.: US 9,106,259 B2
(45) Date of Patent: *Aug. 11, 2015

(54) METHOD AND APPARATUS FOR PERFORMING A CRC CHECK

(75) Inventors: Xiao-an Wang, Allentown, PA (US); Jens Berkmann, Munich (DE)

(73) Assignee: Intel Mobile Communications GmbH, Neubiberg (DE)

( * ) Notice: Subject to any disclaimer, the term of this patent is extended or adjusted under 35 U.S.C. 154(b) by 488 days.

This patent is subject to a terminal disclaimer.

(21) Appl. No.: 13/546,180

(22) Filed: Jul. 11, 2012

(65) Prior Publication Data

US 2012/0278690 A1    Nov. 1, 2012

Related U.S. Application Data

(63) Continuation of application No. 12/271,553, filed on Nov. 14, 2008, now Pat. No. 8,261,175.

(51) Int. Cl.
*G06F 11/10*   (2006.01)
*H03M 13/00*   (2006.01)
*H03M 13/09*   (2006.01)

(52) U.S. Cl.
CPC .................................. *H03M 13/091* (2013.01)

(58) Field of Classification Search
CPC ................................................... H03M 13/091
USPC ........................... 714/758, 776, 807; 708/491
See application file for complete search history.

(56) References Cited

U.S. PATENT DOCUMENTS

| | | | |
|---|---|---|---|
| 6,223,320 B1 | 4/2001 | Dubey et al. | |
| 6,530,057 B1 * | 3/2003 | Kimmitt | 714/758 |
| 6,560,742 B1 | 5/2003 | Dubey et al. | |
| 6,681,364 B1 * | 1/2004 | Calvignac et al. | 714/776 |
| 6,865,708 B2 | 3/2005 | Wang | |
| 7,047,479 B1 | 5/2006 | Hagh-Panah et al. | |
| 7,225,387 B2 | 5/2007 | Lin et al. | |
| 7,363,574 B1 | 4/2008 | Maitland et al. | |
| 2005/0086571 A1 | 4/2005 | Farnsworth | |
| 2005/0097432 A1 | 5/2005 | Obuchi et al. | |
| 2009/0077151 A1 * | 3/2009 | Lablans | 708/491 |
| 2010/0125777 A1 | 5/2010 | Wang et al. | |

OTHER PUBLICATIONS

Shieh, Ming-Der, et al., "A Systematic Approach for Parallel CRC Computations", Journal of Information Science and Engineering, 2001, p. 445-461.
Office Action dated Nov. 23, 2011 in connection with U.S. Appl. No. 12/271,553.
Final Office Action dated Mar. 7, 2012 in connection with U.S. Appl. No. 12/271,553.
Notice of Allowance dated May 4, 2012 in connection with U.S. Appl. No. 12/271,553.

* cited by examiner

*Primary Examiner* — Sam Rizk
(74) *Attorney, Agent, or Firm* — Eschweiler & Associates, LLC

(57) ABSTRACT

A description is given of an apparatus that includes a division unit configured to receive a data stream and to divide the received data stream into a plurality of data segments. The apparatus further includes a plurality of first CRC check units, wherein each of the first CRC check units is configured to perform a first CRC check of a respective one of the plurality of data segments, the plurality of first CRC checks being performed concurrently, and wherein each of the first CRC check units is configured to perform a second CRC check based on an output of the respective first CRC check unit.

27 Claims, 9 Drawing Sheets

METHOD AND APPARATUS FOR PERFORMING A CRC CHECK

REFERENCE TO RELATED APPLICATIONS

This application is a continuation of Ser. No. 12/271,553 filed Nov. 14, 2008 which is entitled "Method and apparatus for performing a CRC check" and incorporated herein its entirety.

FIELD

This invention relates to an apparatus and a method for performing a cyclic redundancy code (CRC) check.

BACKGROUND

A CRC check may, for example, be used for detecting accidental alteration of data during transmission or storage.

For these and other reasons there is a need for the present invention.

BRIEF DESCRIPTION OF THE DRAWINGS

The accompanying drawings are included to provide a further understanding of embodiments and are incorporated in and constitute a part of this specification. The drawings illustrate embodiments and together with the description serve to explain principles of embodiments. Other embodiments and many of the intended advantages of embodiments will be readily appreciated as they become better understood by reference to the following detailed description. The elements of the drawings are not necessarily to scale relative to each other. Like reference numerals designate corresponding similar parts.

DETAILED DESCRIPTION

Figure 1:
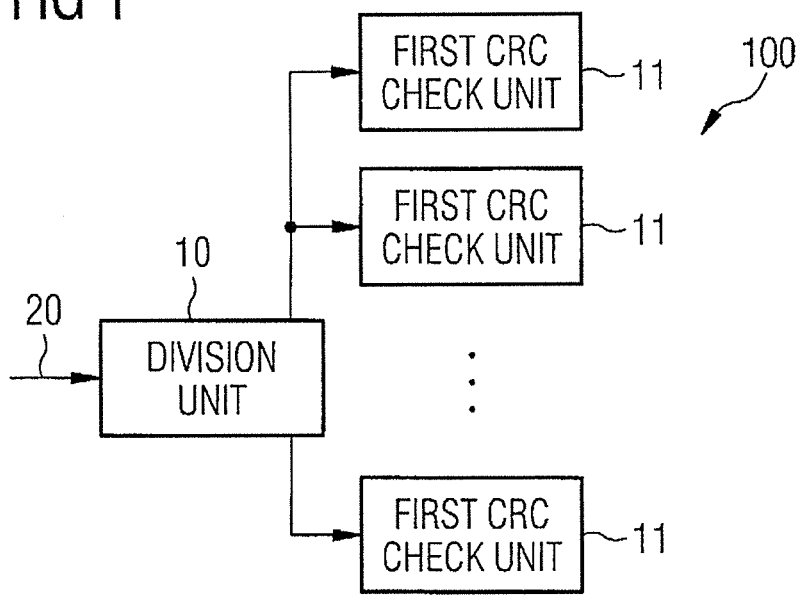
FIG. 1 schematically illustrates a CRC check apparatus with a plurality of CRC check units.

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

It is to be understood that the features of the various exemplary embodiments described herein may be combined with each other, unless specifically noted otherwise.

As employed in this Specification, the terms "coupled" and/or "electrically coupled" are not meant to mean that the elements must be directly coupled together; intervening elements may be provided between the "coupled" or "electrically coupled" elements.

Apparatuses for carrying out cyclic redundancy code (CRC) checks are described below. These apparatuses may receive a data stream. The data stream may be received in the form of single data symbols or may be received in the form of blocks of data or data packets such as data frames, data words, code blocks, transport blocks, etc. The data stream may for example be received with a constant or a time varying clock rate. The received data may consist of or may be regarded as or may be divided into blocks of a given length. For example, the received data stream may contain symbols that indicate where a block starts, where a block ends, or which length a block may have. The block length may also be known or chosen a priori. In the following, a data stream is considered that consists of a given number I of data.

The received data may contain digital values, e.g. binary values. For the ease of understanding, this specification only describes the case of binary values, although the present invention is not restricted to binary values. Those skilled in the art will not have any difficulties in practicing the invention using different number schemes, such as for example ternary or octal number schemes. The description of binary values is thus not meant to limit the scope of the invention but is rather chosen for simplicity and clarity of the description.

The received data stream or a packet of received data or any other packet of data referred to in this specification may be regarded as a polynomial, i.e. the values of the data packet may be regarded as coefficients of different powers of a variable. For example, a data stream with 8 bits of data, such as for example 10110001 with data bits $d_i$ (i=1, 2, ..., 8) may be regarded as a polynomial:

$$D(x) = \sum_{i=0}^{I-1} d_i x^i, I = 8 \qquad (1)$$
$$= 1 \cdot x^0 + 0 \cdot x^1 + 1 \cdot x^2 + 1 \cdot x^3 + 0 \cdot x^4 +$$
$$0 \cdot x^5 + 0 \cdot x^6 + 1 \cdot x^7$$

The bit corresponding to the highest power of the polynomial may either be the first bit or may be the last bit, and the choice may depend on the implementation of the apparatus or method, and either option is contemplated by the invention.

If the number scheme used for the digital representation of the received data stream contains only a limited number of elements, the numbers may be regarded as elements of a finite field, such as the 2-element Galois field GF(2) for a binary number scheme. Finite fields may include definitions for mathematical operations, such as addition, subtraction, multiplication or division. For example, the GF(2) field's addition operation is given by the table

| + | 0 | 1 |
|---|---|---|
| 0 | 0 | 1 |
| 1 | 1 | 0 | and its multiplication operation is given by the table

| × | 0 | 1 |
|---|---|---|
| 0 | 0 | 0 |
| 1 | 0 | 1 |

The GF(2) field's division and subtraction operations are given by the same table as the addition operation.

All defined operations may be used to define a combination of data streams or data packets. For example, data streams may be added, subtracted from each other, multiplied, or divided by each other. As stated above, a person skilled in the art may also opt for a different number representation and/or a different finite field according to a desired implementation of the invention.

In GF(2), the addition, division and subtraction operators correspond to the bitwise operator XOR, and the multiplication operation corresponds to the bitwise operator AND. This means that these calculations may also be computed in hardware, e.g. a multiplication may be computed using AND-gates and a division operation may be computed using XOR-gates. Accordingly, the operations may be carried out using semiconductor chips.

One operation of interest is the calculation of the remainder of a division of a first data stream or data packet, regarded as a first polynomial $D(x)$, by a second data stream or data packet, regarded as a second polynomial $C(x)$, i.e. the modulo calculation $$D(x) \bmod C(x).$$

A cyclic redundancy code (CRC) check may for example be performed on a received data stream using a modulo operation. The result of the operation $D(x) \bmod C(x)$ is called the CRC check value. The CRC check value may for example be used to detect whether a data stream or data packet has been received correctly. For that purpose, the CRC check value may be appended to a data stream or a data packet in a transmitting device. In the receiving device, the CRC check value of the received data stream including the appended CRC check value is computed and should be 0 if the data have been received without any error.

CRC checks may also be integrated in various other devices and electrical circuits. CRC checks may be used in many communication systems, for example to provide reliable error detection or to check correct reception of received data. The CRC check apparatuses or methods described below may be used wherever CRC check values need to be calculated, e.g. on the transmit side and/or the receive side or in communication devices based on communication standards such as GSM (Global System for Mobile Communications), UMTS (Universal Mobile Telecommunications System), HSDPA (High-Speed Downlink Packet Access), HSUPA (High-Speed Uplink Packet Access), HSPA+ (Evolved High-Speed Packet Access) 42 Mbps, LTE (Long Term Evolution), LTE 300 Mbps, WIMAX (Worldwide Interoperability for Microwave Access), Bluetooth, etc.

CRC checks may also be combined with turbo decoding. This may require that a CRC check value is embedded in every turbo codeword. The ever increasing data rates of communication standards may result in turbo decoding engines which produce multiple bits per hardware cycle. In order to meet the latency requirement of the respective standard, it may be advantageous to keep the processing time of the CRC check as low as possible.

A CRC check apparatus may, for example, be positioned downstream of a turbo decoder to detect whether the output of the turbo decoder is a properly decoded data stream.

A CRC check apparatus may also be positioned within a turbo decoder. A turbo decoder may include two decoding units coupled to each other, with the first decoding unit working on data in normal or inverse order and the second decoding unit working on data with scrambled order. The outputs of the two decoding units are expected to converge towards a correctly decoded data packet. For example, according to a comparison-based approach it is detected whether the outputs of the two decoding units are identical so that it can be concluded that the data packet has been decoded correctly. However, this method may possibly fail in case where the decoding cannot be improved although the code word has not been correctly decoded yet. As an alternative or in addition to positioning a CRC check apparatus downstream of the turbo decoder, a CRC check apparatus may for example be positioned after the first decoding unit and may be used for early termination of the iterative turbo decoding process. In this case the CRC check apparatus may be used for early stopping the iterative process, e.g. when the CRC check indicates that the data stream has been decoded without any error. Such a CRC-assisted turbo decoder may require one iteration less than a conventional turbo decoder and thus may consume less power and less processing time. A CRC check apparatus may also be positioned after the second decoder to save unnecessary execution time and power, but may need to wait until all data bits of a code block are decoded by the second decoder before calculating the CRC check value.

A CRC value may be calculated by sequentially feeding data bits of a data stream into one single linear feedback shift register. The processing speed of such a apparatus is 1 bit per hardware cycle.

FIG. 1 schematically illustrates an apparatus 100 for performing CRC checks. The apparatus 100 includes a division unit 10 (or splitting unit) and a plurality of first CRC check units 11. The division unit 10 is configured to receive a data stream 20 and to divide (or split) the data stream 20 into a plurality of segments of data. In one embodiment, the number of segments of data may correspond to the number of first CRC check units 11 and the segments of data may have equal length. Each of the segments of data may be sent to a different one of the first CRC check units 11. Each of the first CRC check units 11 may be configured to perform a CRC check of a respective one of the plurality of segments of data. As shown in FIG. 1, the first CRC check units 11 may be arranged in parallel and may calculate the respective CRC checks concurrently or simultaneously in one embodiment.

As an alternative to sending the segments of data to the first CRC units 11, the division unit 10 may be configured in another embodiment to indicate to each of the first CRC check units 11 which part of the data stream 20 is to be processed by the respective first CRC unit 11.

Figure 2A:
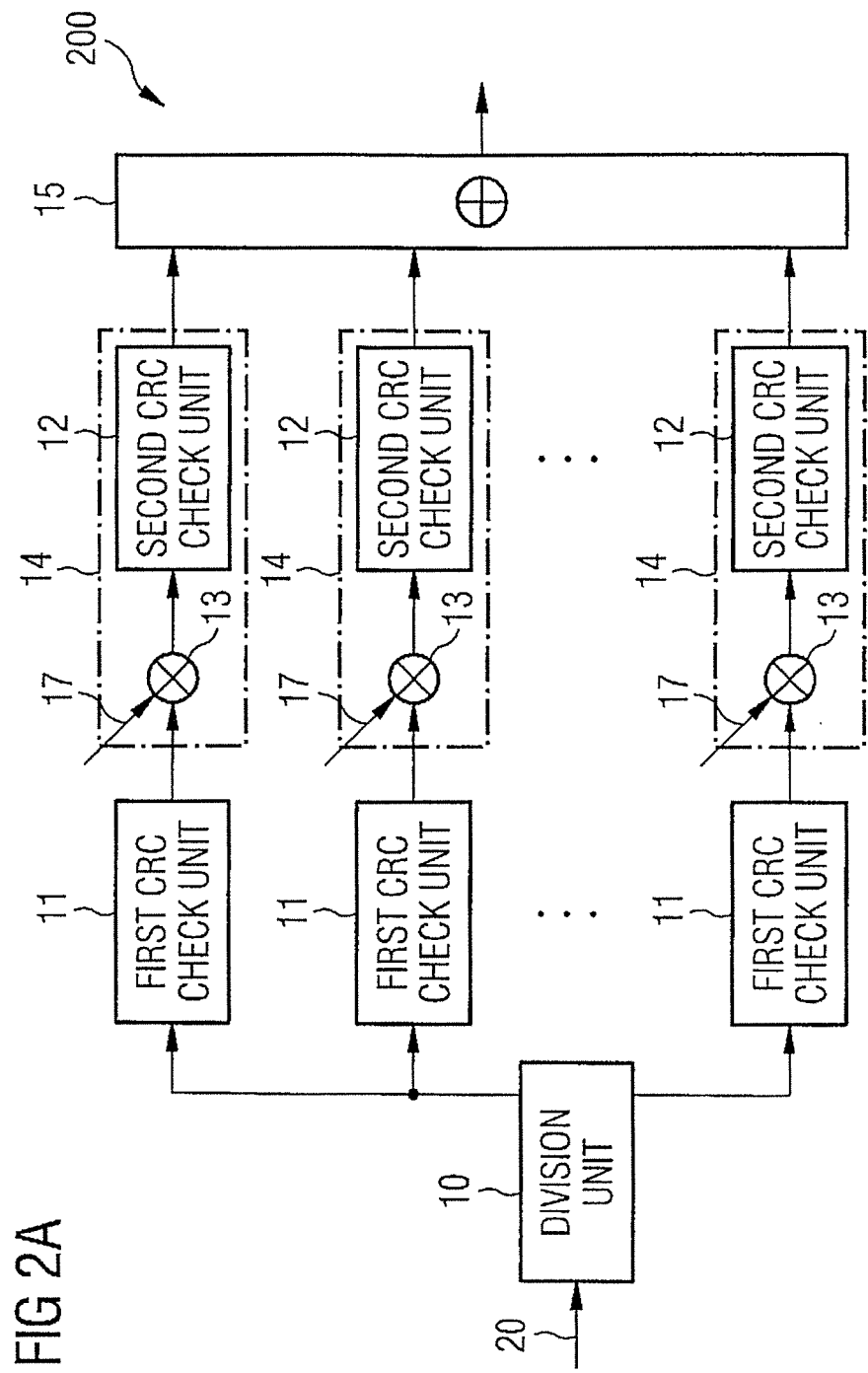
FIGS. 2A to 2C schematically illustrate embodiments of CRC check apparatuses that include a plurality of CRC check units and a unit for combining the outputs of the plurality of CRC check units.

FIG. 2A schematically illustrates an apparatus 200 for performing CRC checks. Similar to the apparatus 100 illustrated in FIG. 1, the apparatus 200 includes a division unit 10 and a plurality of first CRC check units 11. The apparatus 200 further includes a plurality of second CRC check units 12, a plurality of multiplication units 13 and a combining unit 15. A multiplication unit 13 together with a downstream connected second CRC check unit 12 may be regarded as a combined CRC check unit 14.

In one embodiment, the division unit 10 may be configured to receive a data stream 20 with I data bits, wherein I is a positive integer. The division unit 10 may be configured to divide the data stream 20 into a plurality of segments, for example M segments, wherein M may be an arbitrary positive integer, and to send the segments of data to the plurality of first CRC check units 11. In general, M may take the value of any positive integer and, in particular, may be equal to the number of first CRC check units 11. The number of segments of data and the number of first CRC check units 11 may be identical or may differ. For example, it may be possible that the number of first CRC check units 11 is bigger than the number of segments of data. In this case, there may be at least one first CRC check unit 11 which is not used for computing a CRC check value for a segment of data of the actual data stream 20. It may also be possible that the number of first CRC check units 11 is smaller than the number of segments of data. In this case, there may be at least one first CRC check unit 11 which has to compute CRC check values for at least two segments of data. For example, the number of segments of data may be two times the number of first CRC check units 11, and each of the first CRC check units 11 may perform a CRC check of two segments of data.

The length of the segments of data or the number of data bits contained in the segments of data may be different or may be equal. In the embodiment shown in FIG. 2A, a data stream 20 of length I is received and is divided into M segments of equal length N=I/M. Furthermore, in the embodiment shown in FIG. 2A, each of the segments of data is sent to a different one of the first CRC check units 11.

In one embodiment, the data bits in the segments of data do not necessarily show up in the same order as in the received data stream 20, and the segments of data do not necessarily include the data bits in the same order as in the received data stream 20. In general, the data bits of a segment of data may be selected arbitrarily from the data stream 20. In one embodiment shown in FIG. 2B, each of the segments of data contains consecutive data of the received data stream 20 in the same order as contained in the data stream 20. According to this embodiment, a data stream of 20 data bits is segmented into 4 segments of data, each of these segments of data containing 5 data bits. In embodiments shown in FIGS. 4A to 4C, which are described further below, the segments of data are formed by assigning each Mth data bit of the data stream 20 to one segment of data, wherein M is the number of first CRC check units 11. In other words, the consecutive data contained in each of the segments of data are separated by M−1 data in the data stream 20. Further, in, the embodiments shown in FIGS. 4A to 4C, each of M consecutive data in the data stream is assigned to a respective one of M segments of data.

In one embodiment, the data stream 20 may be regarded as a polynomial with coefficients $d_i$ with i=0, 1, . . . , I−1, and the segments of data may be regarded as polynomials $D_m(x)$ with m=0, 1, . . . , M−1.

The apparatus 200 of FIG. 2A is configured to perform a CRC check against CRC check data C using a technique referred to as segmented parallel CRC check. The CRC check data C may be regarded as a polynomial C(x) in GF(2) and may have a length or degree K which is less than the length I of the received data stream 20 (K<I). K may be any positive integer. In the LTE standard, for example, K is 24. Regarding both the received data stream 20 and the CRC check data C as polynomials, the CRC check performed in the apparatus 200 may be regarded as computing the remainder D(x) mod C(x).

Each of the first CRC check units 11 may be configured to calculate the remainder of a respective segment of data $D_m$ using the CRC check data C, i.e. may be configured to calculate the remainder $D_m(x)$ mod C(x). Each of the first CRC check units 11 may output a data stream or data packet that indicates the CRC check value of the segment $D_m$ of data that has been sent to the respective, for example mth, first CRC check unit 11. In one embodiment, each of the first CRC check units 11 may include a linear feedback shift register similar to the examples shown in FIGS. 3A and 3B.

The output of each of the first CRC units 11 may be input into a respective multiplication unit 13, where it is multiplied with another input data stream or data packet 17. The number of multiplication units 13 may be equal to the number of first CRC check units 11 and the output of each of the first CRC check units 11 may be connected to an input of a different one of the multiplication units 13 as shown in FIG. 2A.

Each multiplication unit 13 may have at least two inputs. One input of each multiplication unit 13 may be coupled to the output of a respective one of the first CRC check units 11. The other input of each multiplication unit 13 may receive or may have access to a respective one of pre-computed values which may be in the form of a further data stream or data packet 17. In one embodiment, this further data stream or data packet 17 may comprise a pre-computed value which is multiplied by the other input or inputs of the multiplication units 13. The pre-computed values 17 for the plurality of multiplication units 13 may, for example, be stored in a memory and may be computed from the position of the segment of data which was sent to the respective first CRC check unit 11 that is positioned upstream of the respective multiplication unit 13. Each of the pre-computed values 17 may correspond to a respective one of the segments of data and may be computed from the position of the respective segment of data in the data stream 20 and may be input into a respective multiplication unit. The pre-computed values 17 for different multiplication units 13 may differ. A multiplication may be computed by regarding the data streams as polynomials as described above. The multiplication may for example be the multiplication operation of the Galois field as described above. In this embodiment, the multiplication unit 13 may be regarded as a Galois field multiplication unit.

The output of each of the multiplication units 13 may be coupled to an input of a respective one of a plurality of second CRC check units 12. The number of second CRC check units 12 may be equal to the number of first CRC check units and/or the number of segments of data. The second CRC check units 12 may include a linear feedback shift register and may be similar to or equal to the first CRC check units 11 in one embodiment. The second CRC check units 12 may be configured to calculate a CRC check value of the output of the multiplication units 13.

Each of the first CRC check units 11 may define a branch of the CRC check apparatus 200. In one embodiment, the multiplication units 13 and the second CRC check units 12 contained in the same branch of the apparatus 200 may be combined in a combined CRC check unit 14, an example of which is described further below and is illustrated schematically in FIGS. 3A and 3B.

The outputs of the second CRC check units 12 or the combined CRC check units 14 may be coupled to an input of a combining unit 15. The combining unit 15 may be configured to combine the outputs of the plurality of parallel CRC computation branches. The combining unit 15 may use the position of the respective segment of data in the data stream 20 for correct combination of the data bits.

The output of the combination unit 15 may represent the CRC value of the received data stream 20 and may be used for further processing. The CRC value may, for example, be sent to a unit which evaluates the calculated CRC value D(x) mod C(x), for example for checking whether the received data has been received without transmission errors. The output value may also be used for appending a CRC check value to the data stream 20, for example if the apparatus 200 is located in a transmitter.

The illustration shown in FIG. 2A does not necessarily mean that the CRC check units 11 and 12 need to be implemented by different units. In one embodiment, it may be provided that each CRC computation branch of the apparatus 200 contains a single CRC check unit which is used in a recursive manner. This means that the CRC check unit of a respective one of the branches performs the first CRC check, sends the result of the first CRC check to the multiplication unit 13 and subsequently performs the second CRC check using the output of the multiplication unit 13.

Figure 2B:
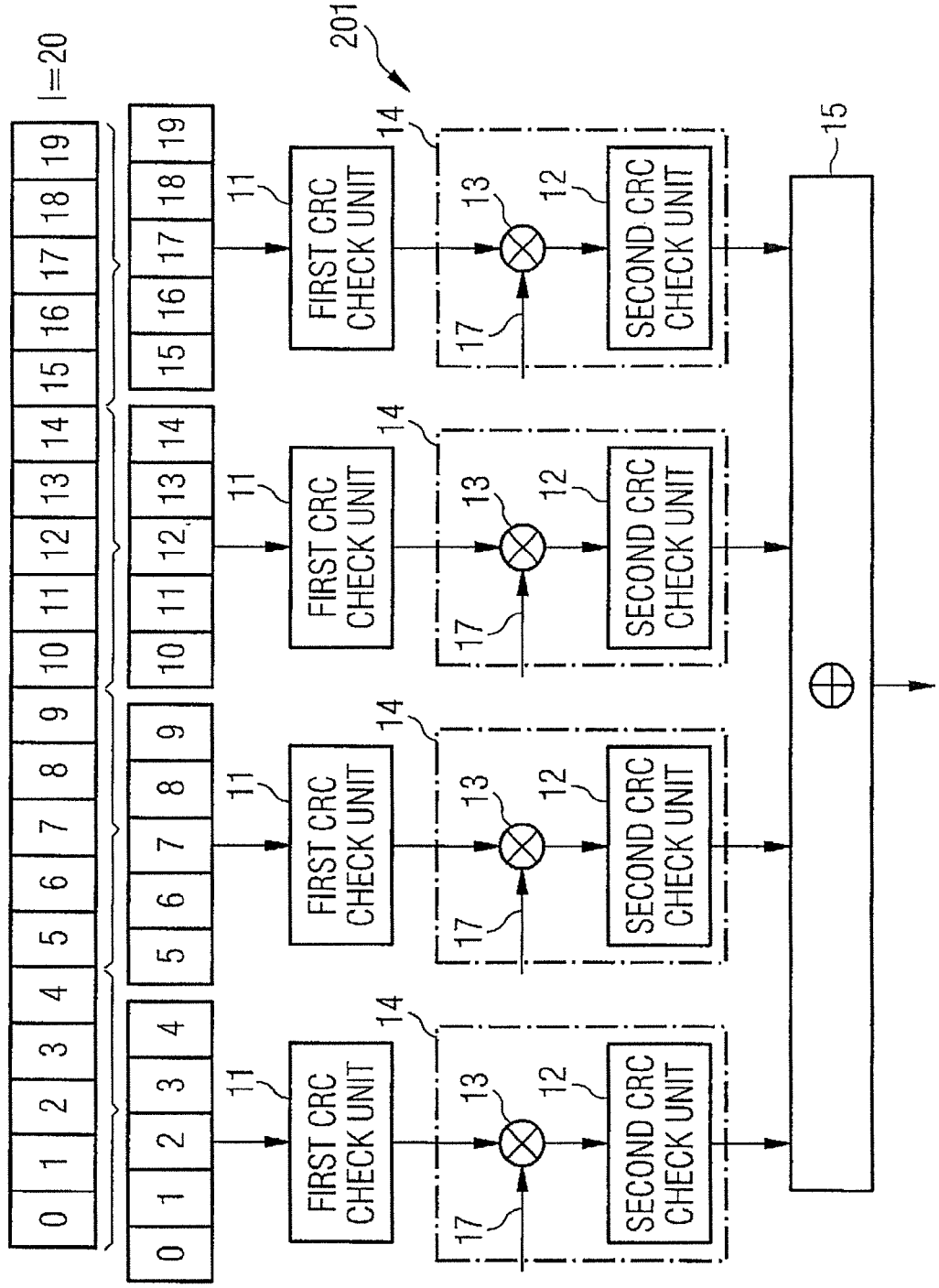

FIG. 2B schematically illustrates an apparatus 201 for performing CRC checks. The apparatus 201 receives a data stream 20 of, for example, I=20 data bits. Typical lengths I of data streams 20 may for example be between 10 and 150,000 data bits, e.g. in LTE. The data stream 20 is segmented into, for example, M=4 segments by a division unit 10 and each of the 4 segments of data includes, for example, N=5 data bits. In this embodiment, the received data stream 20 is segmented in consecutive segments of data bits such that the order of the data bits in the segments of data corresponds to the order in the received data stream 20. These M segments of data $D_m$ can thus be described by polynomials:

$$D_m(x) = \sum_{n=0}^{N-1} d_{mN+n} x^n, m = 0, 1, \ldots, M-1, \quad (2A)$$

and the CRC check D(x) mod C(x) can be written as $$D(x) \bmod C(x) = \left( \sum_{m=0}^{M-1} x^{mN} \cdot D_m(x) \right) \bmod C(x). \quad (2B)$$

Each of the M segments of data is sent to one of the M parallel CRC computation branches. Each branch may begin with a first CRC check unit 11. When using the polynomial formulation described above, the first CRC check units 11 compute the following terms:

$$B_m(x) = D_m(x) \bmod C(x) = \left( \sum_{n=0}^{N-1} d_{mN+n} x^n \right) \bmod C(x) \quad (2C)$$

The output of each of the first CRC check units 11 is multiplied in the multiplication units 13 with a respective pre-computed value 17 which may be expressed by $$A_m(x) = x^{mN} \bmod C(x), m=0,1,\ldots,M-1 \quad (2D)$$

or may be expressed by $$A_m(x) = x^{mN}, m=0,1,\ldots,M-1. \quad (2E)$$

In one embodiment, the pre-computed values 17 may be pre-computed well before the arrival of the received data stream 20. They may be stored in a memory after assembling the apparatuses 200, 201 and 202. The memory may be configured to store M packets 17 of data, wherein each of the M packets 17 may have a length equal to or smaller than the length K of the CRC check polynomial C(x). In particular, the memory may be configured to store M data packets of K−1 data bits.

The outputs of the multiplication units 13 may be described by $$(A_m(x) \cdot B_m(x)). \quad (2F)$$

and are input to the second CRC check units 12, which calculate outputs that may be described by $$(A_m(x) \cdot B_m(x)) \bmod C(x). \quad (2G)$$

The outputs of the M second CRC check units are then combined in the combining unit 15, the output of which may be described by the polynomial $$\sum_{m=0}^{M-1} [(A_m(x) \cdot B_m(x)) \bmod C(x)]. \quad (2H)$$

The term of equation (2H) corresponds to the CRC value of the received data stream D.

Figure 2C:
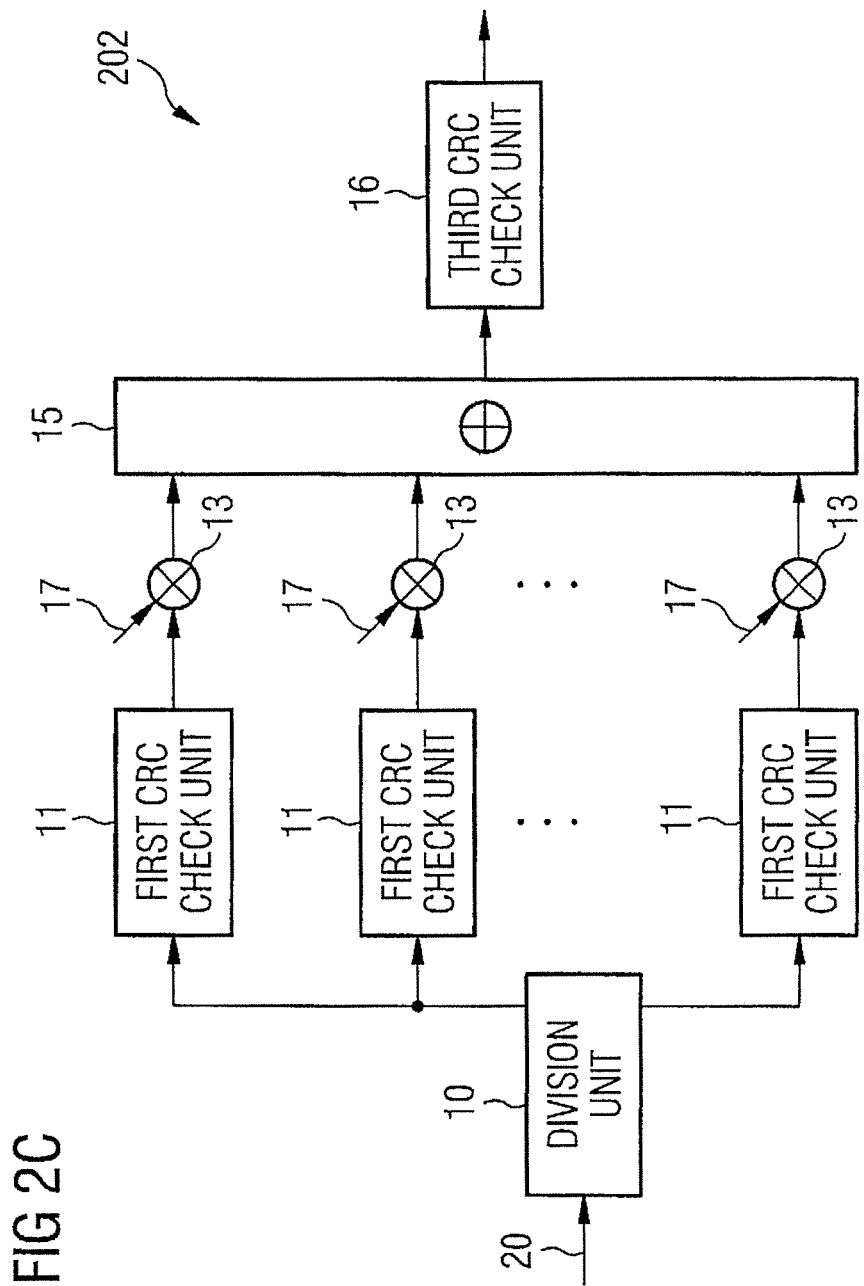

FIG. 2C shows an apparatus 202 which includes essentially the same components as the apparatuses 200 and 201, but does not include the second CRC check units 12 downstream of the multiplication units 13. Instead, the outputs of the multiplication units 13 are directly input into the combining unit 15, the output of which may be described by a polynomial $$\sum_{m=0}^{M-1} [A_m(x) \cdot B_m(x)]. \quad (2J)$$

The output of the combination unit 15 may be coupled to a third CRC calculation unit 16 for a further CRC check using the CRC check data C. In one embodiment, the third CRC check unit 16 may be equal or similar to the first CRC check units 11.

The output of the third CRC check unit 16 may be described by a polynomial $$\left\{ \sum_{m=0}^{M-1} [A_m(x) \cdot B_m(x)] \right\} \bmod C(x) = D(x) \bmod C(x). \quad (2K)$$

Similar to equation (2H), equation (2K) corresponds to the CRC value of the received data stream D.

The illustration shown in FIG. 2C does not necessarily mean that the CRC check units 11 and 16 need to be implemented by different units, e.g. in one embodiment it may be provided that the CRC check of the third CRC check unit 16 is performed by one of the first CRC check units 11.

Additional processing units, for example additional CRC check units may be added to the apparatuses 200, 201 and 202 without departing from the scope of the present invention.

Figure 3A:
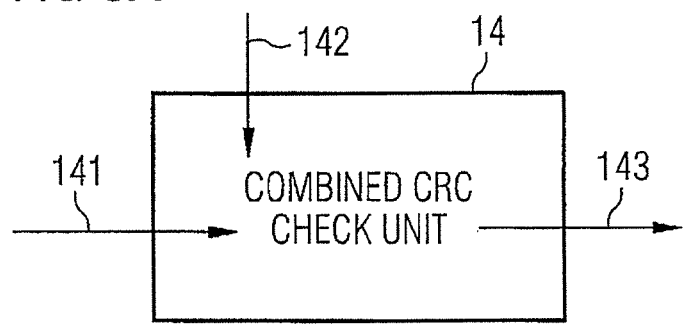
FIGS. 3A and 3B schematically illustrate embodiments of CRC check units.

FIG. 3A schematically illustrates an example of a combined CRC check unit 14 as shown in FIGS. 2A and 2B. In one embodiment, such a combined CRC check unit 14 may have two inputs 141 and 142 to which data streams A and B may be input, respectively, and may have an output 143, where a data stream 143 corresponding to the result of the computation A(x)*B(x) mod C(x) is output. The first CRC calculation units 11 and/or the third CRC calculation units 16 may be similar to or equal to the combined CRC check unit 14 shown in FIG. 3A. For example, the first and/or third CRC calculation units 11, 16 may be formed by omitting the second input 142 of a combined CRC check unit 14, by neglecting the second input 142, or by setting the data stream B at the second input 142 to 1 for each data bit such that the Galois multiplication of A and B is equal to A.

Figure 3B:
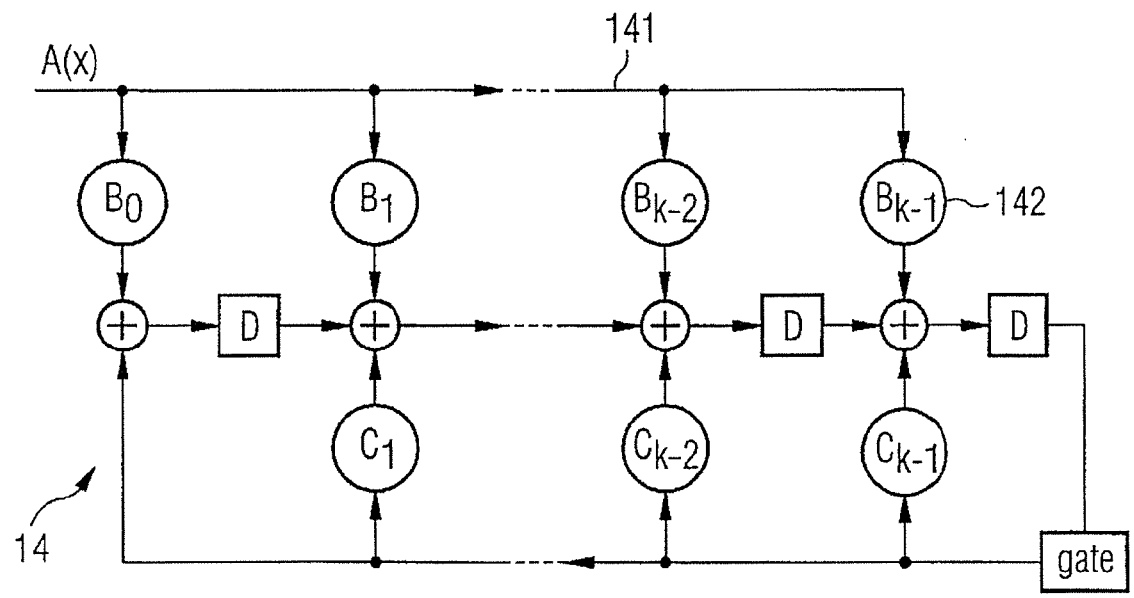

FIG. 3B schematically illustrates an example of a combined CRC check unit 14 with a linear feedback shift register. The data stream A(x) is sent to the input 141 of the linear feedback shift register and is multiplied bit by bit with the data stream B(x) with bits $B_k$ (k=0, 1, ..., K−1) of the input 142. This may be achieved by bitwise ANDing corresponding data bits. The result obtained by the multiplication is input to the K inputs of the linear feedback shift register, XORed with the bits $C_k$ (k=0, 1, ..., K−1) of the CRC check data C, delayed in the delay modules D and then input into the next XOR unit. A similar feedback shift register may be used for the first and/or third CRC calculation units 11, 16. In this case the multiplication with the data stream B(x) can be omitted or all bits $B_k$ (k=0, 1, ..., K−1) can be set to 1.

Figure 4A:
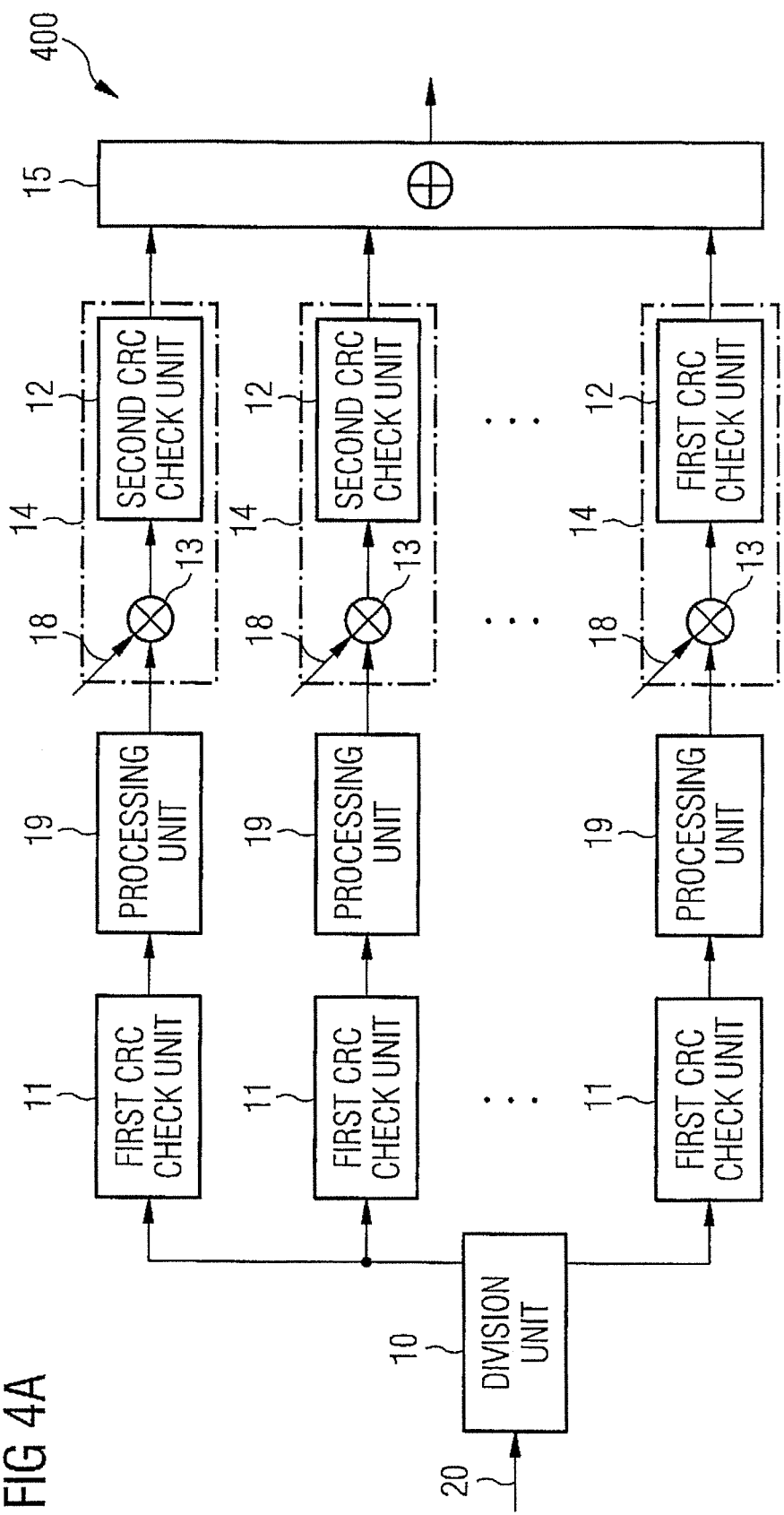
FIGS. 4A to 4C schematically illustrate embodiments of CRC check apparatuses that include a plurality of CRC check units and a unit for combining the outputs of the plurality of CRC check units.

FIG. 4A schematically illustrates an apparatus 400 for performing CRC checks. The apparatus 400 includes a division unit 10, a plurality of first CRC check units 11, a plurality of processing units 19, a plurality of multiplication units 13, a plurality of second CRC check units 12 and a combining unit 15. The components of the apparatuses 200 and 400 denoted by the same reference numerals are identical or similar unless otherwise stated in the following.

Figure 4B:
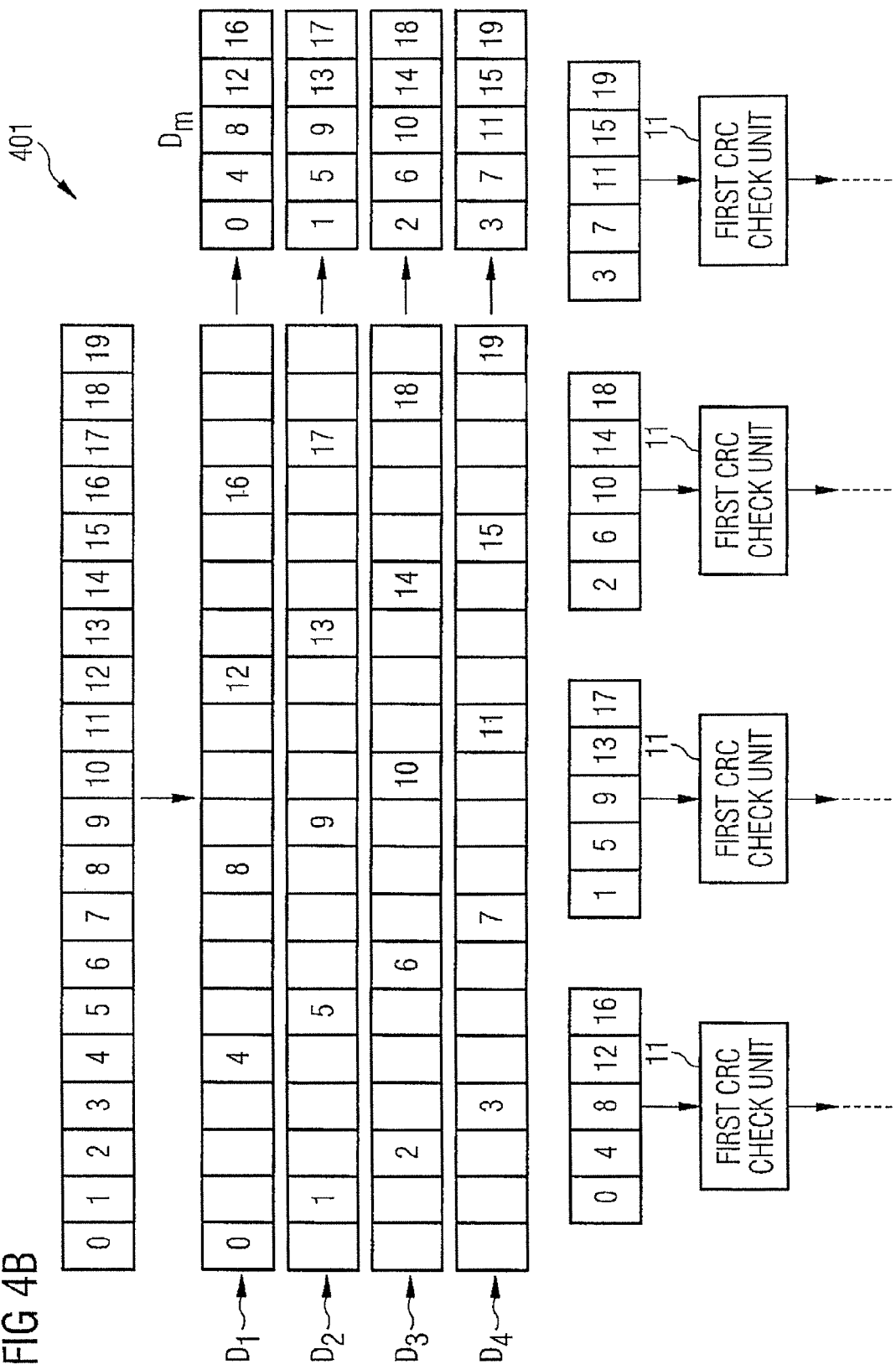

The division unit 10 used in the embodiment shown in FIG. 4A may be configured to select data from the data stream 20 according to a scheme called interleaving. According to this scheme the data stream 20 is divided into M segments of data such that the bits assigned to one segment of data are separated by M−1 bits in the received data stream 20. An example is shown in FIG. 4B, where the mth of the first CRC check units 11 receives the data bits n*M+m with n=0, 1, ..., N−1 and N=I/M. From a mathematical point of view, the segment of data that is sent to the mth first CRC check unit 11 may be described by the polynomial $$D_m(x) = \sum_{n=0}^{N-1} d_{nM+m} x^n, m = 0, 1, \ldots, M-1 \quad (4A)$$

and the CRC check D(x) mod C(x) may be written as $$D(x) \bmod C(x) = \left( \sum_{m=0}^{M-1} \sum_{n=0}^{N-1} d_{nM+m} x^{nM+m} \right) \bmod C(x) \quad (4B)$$

$$= \sum_{m=0}^{M-1} x^m \left[ \left( \sum_{n=0}^{N-1} d_{nM+m} x^{nM} \right) \bmod C(x) \right] \bmod C(x)$$

$$= \sum_{m=0}^{M-1} x^m [D_m(x^M) \bmod C(x)] \bmod C(x).$$

In the case, where M is a power of 2, the identity $$D_m(x^m) = [D_m(x)]^M \quad (4C)$$

holds. Accordingly, the CRC check D(x) mod C(x) may be written as $$D(x) \bmod C(x) = \sum_{m=0}^{M-1} x^m [D_m(x) \bmod C(x)]^M \bmod C(x) \quad (4D)$$

$$= \sum_{m=0}^{M-1} x^m [r_m(x)]^M \bmod C(x)$$

$$= \sum_{m=0}^{M-1} x^m [r_m(x^M) \bmod C(x)] \bmod C(x)$$

with $r_m(x) = D_m(x) \bmod C(x)$. Equation (4C) is also true for q-element Galois fields GF(q), with q being a power of a prime number p, i.e. $q = p^\mu$, with μ being a positive integer, and with M being a power of q, i.e. $M = q^r$, r=1, 2, 3, ....

Accordingly, each of the first CRC check units 11 may for example be configured to compute a CRC check value $r_m(x) = D_m(x) \bmod C(x)$, which may be fed into the corresponding processing unit 19. The processing unit 19 may be configured to calculate a power of its input $r_m(x)$, and may, for example, output a data packet that corresponds to a polynomial $r_m(x)^M$. If the conditions for equation (4C) are met, the output of the processing unit 19 is identical to a data packet which corresponds to $r_m(x^M)$ since $r_m(x)^M = r_m(x^M)$ or $D_m(x)^M = D_m(x^M)$, for example if M is a power of 2.

Although the relation (4C) or $r_m(x)^M = r_m(x^M)$ holds only for the conditions described above, e.g. for M being a power of 2, embodiments based on that relation do not necessarily need to have a corresponding number of first CRC check units 11, e.g. the number of first CRC check units 11 does not have to be a power of 2, since it was observed that any number of first CRC check units 11 or parallel CRC computation branches may be used instead. All such variations are contemplated by the invention.

The processing unit 19 may for example calculate the Mth power of its input signal directly, e.g. by multiplying the input value M times by itself. The processing unit 19 may also calculate the Mth power of its input by calculating the Mth power of the variable x of the polynomial in the polynomial formulation. This is possible if equation (4C) holds, e.g. if M is a power of 2, i.e. if the number of first CRC check units 11 and/or segments of data is 2, 4, 8, 16, 32, 64, etc. Regarding the input to the processing units 19 as data packets, this may for example be achieved by adding M−1 zeros after each data bit of the data packet sent to the input of a processing unit 19. This is possible because the following identity holds in GF(2):

$$(1x^0 + 1x^2)^2 = 1 + x^4 = 1x^0 + 0x^1 + 0x^2 + 0x^3 + 1x^4,$$

i.e. the data stream may be expanded as follows:

101 → 100010

In this case, calculating the Mth power of an input data packet may be identical to adding M−1 zeros after each data bit. It is evident that apart from calculating the power of the variable in the processing unit 19 as described above, one may also inform the downstream unit or units about the position of the data bits, e.g. by indicating that the second data bit should be interpreted as if it were a Mth data bit. In the example $(1x^0 + 1x^2)^2$, it would be possible to send the first bit to the first input, the second bit to the third input and the third bit to the fifth input of the linear feedback shift register, i.e. the calculation of the power may be replaced by sending the data bits to the inputs of the linear feedback shift register as if a required number of zeros would have been added to the data packet.

The output of the processing units 19 may be coupled to the inputs of the multiplication units 13. The multiplication units 13 may multiply their inputs with pre-computed values 18. The pre-computed values 18 may, in one embodiment, correspond to the position of the segment of data in the data stream 20, the CRC check value of which is calculated in the respective branch of the CRC check apparatus 401. The pre-computed values 18 may for example correspond to polynomials $$A_m(x) = x^m, m = 0, 1, \ldots, M-1$$

or may correspond to polynomials $$A_m(x) = x^{mM} \bmod C(x), m = 0, 1, \ldots, K-1.$$

In one embodiment, the pre-computed values 18 may also be CRC check values, such as $A_m(x) \bmod C(x)$, and the input values that are multiplied by the pre-computed values 18 may also be CRC check values of the outputs of the processing units 19. This may, for example, be achieved by arranging further CRC check units, which are not shown in FIGS. 4A to 4C, between the processing units 19 and the multiplication units 13. In such a case, the inputs to the multiplication units 13 may for example be described by polynomials $$B_m(x) = r_m(x^M) \bmod C(x)$$
$$= r_m(x)^M \bmod C(x),$$
$$m = 0, 1, \ldots, M-1.$$

The pre-computed values 18, such as $x^m$ or $[x^m \bmod C(x)]$, may be stored in a memory, in particular a memory with M or K−1 elements of M or K−1 data bits, respectively.

The outputs of the multiplication units 13 may be described by polynomials $$A_m(x) B_m(x).$$

The second CRC check units 12 calculate CRC values of the polynomials $A_m(x) B_m(x)$:

$$(A_m(x) B_m(x)) \bmod C(x)$$

In the combining unit 15, the outputs of the M parallel CRC computation branches are combined to a data packet which may be described by the following polynomial:

$$\sum_{m=0}^{M-1} [(A_m(x) \cdot B_m(x)) \bmod C(x)] \quad (4E)$$

Equation (4E) corresponds to the CRC value of the received data stream D.

Figure 4C:
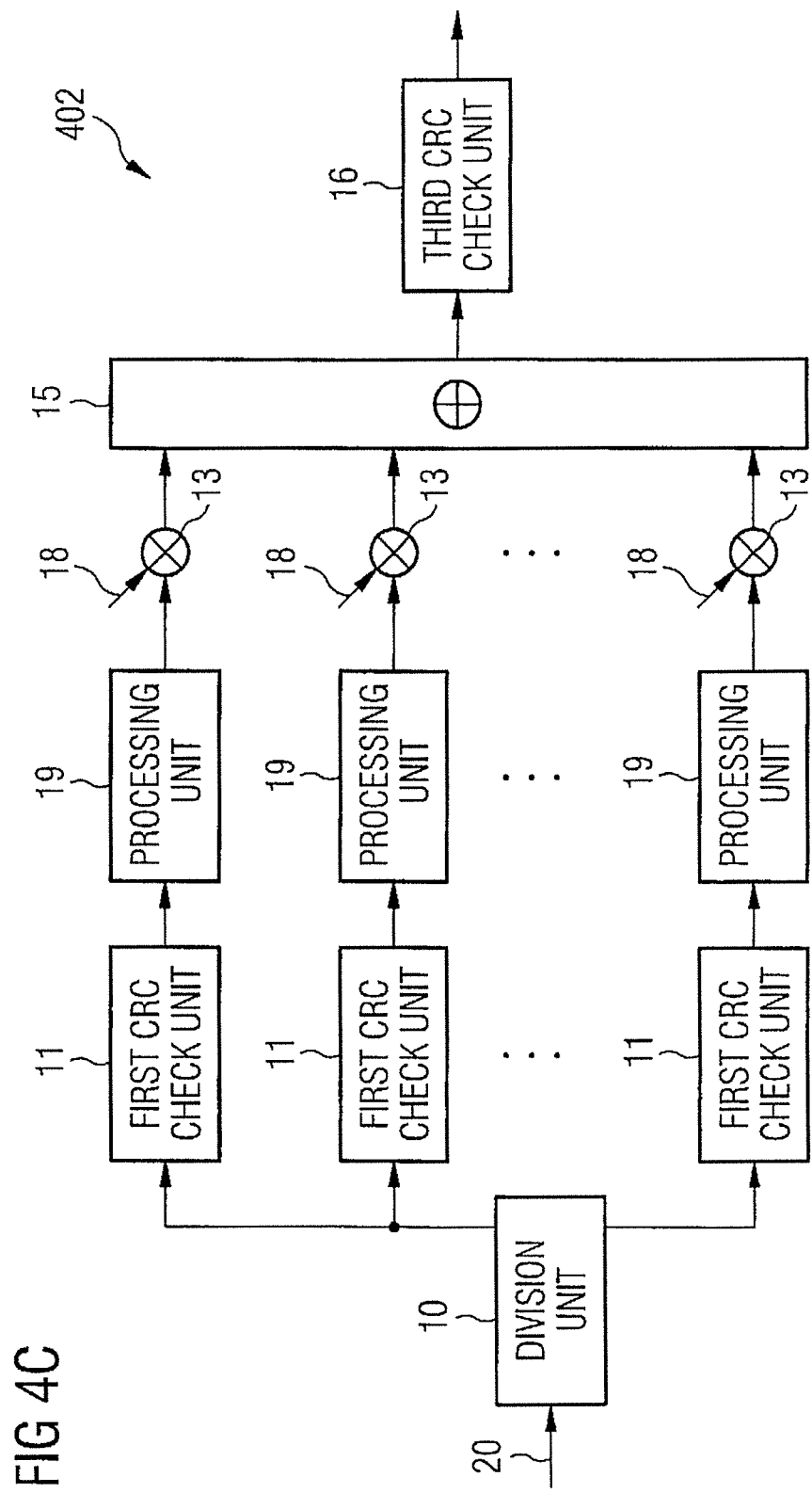

FIG. 4C schematically shows an apparatus 402 for performing CRC checks. The apparatus 402 largely corresponds to the apparatus 401 but does not include the second CRC check units 12 downstream of the multiplication units 13. Instead, the outputs of the multiplication units 13 are directly fed into the combining unit 15, the output of which may be described by a polynomial $$\sum_{m=0}^{M-1} [A_m(x) \cdot B_m(x)] \quad (4F)$$

so that the output of the third CRC check unit 16 may be described by a polynomial $$\left\{ \sum_{m=0}^{M-1} [A_m(x) \cdot B_m(x)] \right\} \bmod C(x) = D(x) \bmod C(x). \quad (4G)$$

Equation (4G) corresponds to the CRC value of the received data stream D.

It should be evident to those skilled in the art that additional processing units, for example additional CRC check units may be added to the apparatuses 400, 401 and 402 without departing from the scope of the present invention. It is further evident to those skilled in the art that the embodiments and/or equations shown above may easily be modified. For example, the equations may be modified such that the sub-terms may be grouped differently, and the embodiments described above may be modified accordingly without departing from the scope of the invention.

Both segmented and interleaved parallel CRC checks as described above may reduce the CRC-checking time by a factor that equals the degree of parallelization when compared to a non-parallelized CRC check apparatus. The degree of parallelization may, for example, be defined as the number of segments of data into which the data stream 20 is segmented, or as the number of first CRC check units 11 or the number of parallel CRC computation branches.

In segmented parallel CRC, the pre-computed values 17 may depend on the length of the received data stream 20, e.g. the length of a data frame or a turbo code word. The pre-computed values 18 of interleaved parallel CRC may be chosen such that they are independent of the length of the received data stream, i.e. they may only depend on K.

The apparatuses described above may be configured to run at the same clock rate at which the data bits are received in the data stream 20. It may thus not be necessary to clock the CRC check apparatuses with a clock rate which is lower than the data bit sampling rate. The CRC check apparatuses described above may also reduce latency and may allow meeting given latency requirements more easily.

The output of an electronic circuit may be delayed with respect to an input, i.e. may require computation time. The delay or computation time may be determined by the logic depth of the electronic circuit, i.e. the number and complexity of the operations which have to be performed after each other, or the number and delay generated by transistors coupled in series in that circuit. The components which cause the longest delays may determine the maximum clock rate at which the CRC check apparatuses described above can be operated. In the apparatuses described above, the determining components may, for example, be the first CRC check units 11, since these units may have to calculate a CRC check value from a segment of data of about 100 to 150,000 data bits, whereas the data processed by the second or third CRC check units may for example have a length similar to the length of the CRC check data C, e.g. may have a length of about 24 data bits. The delays introduced by other components of the apparatuses described above may be negligible compared to the delay introduced by a first CRC check unit 11. For example, their influence may amount to less than 10%, 1% or 0.1% of the computation time.

When raising the degree of parallelization, each of the first CRC check units may have to process a smaller segment of data, and the computation time for computing the CRC check value may change inverse to the rise in parallelization. For example, doubling the degree of parallelization may reduce the time required for computing the CRC check value at a the same clock rate by a factor of 2. The computation time required by the first CRC check units 11 may not be raised by the degree of parallelization. Components such as a combining unit 15 may only have negligible or small influence on the computation time of less than 10%, 1% or 0.1%. Similarly, the maximum clock rate may be roughly independent of the degree of parallelization and may be influenced by less than 10%, 1% or 0.1%. Accordingly, the degree of parallelization may be changed arbitrarily if the CRC check apparatus is operated at a clock rate which is less than 90%, 99% or 99.9% of the maximum clock rate.

Figure 5:
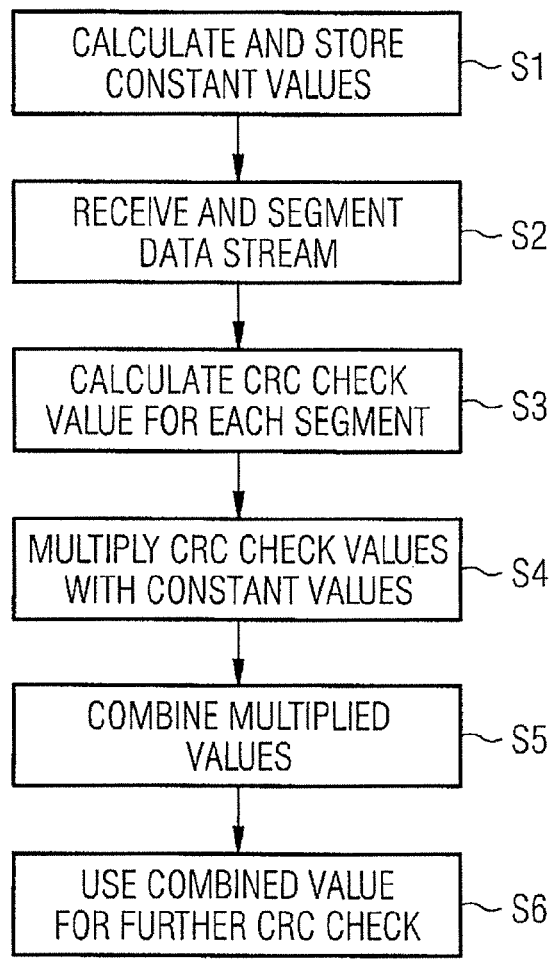
FIG. 5 schematically illustrates an embodiment of a method for performing a CRC check.

FIG. 5 schematically illustrates an example of a method for performing a CRC check using a plurality of parallel or simultaneous CRC checks. The example shown in FIG. 5 may, for example, be carried out using the apparatus 202 or 402. The method includes steps S1 to S6. Method step S1 includes the calculation of values which are constant and which thus can be pre-calculated. These values may, for example, be stored in a memory for easy access. In method step S2, a data stream is received and split or segmented into a number of segments of data. In method step S3, a CRC check value is calculated for each of the segments of data. In method step S4, each of the CRC check values is multiplied by a respective one of the pre-computed values. The respective pre-computed values may, for example, indicate the position of the respective one of the segments of data in the received data stream. In method step S5, the multiplied values are combined according to the position of the respective segment of data in the data stream. In method step S6, the combined value is used for a further CRC check. The CRC check value obtained from method step S6 may correspond to the CRC check value of the received data stream.

It will be evident to those skilled in the art that the method described in FIG. 5 may be amended according to one of the embodiments described above.

Figure 6:
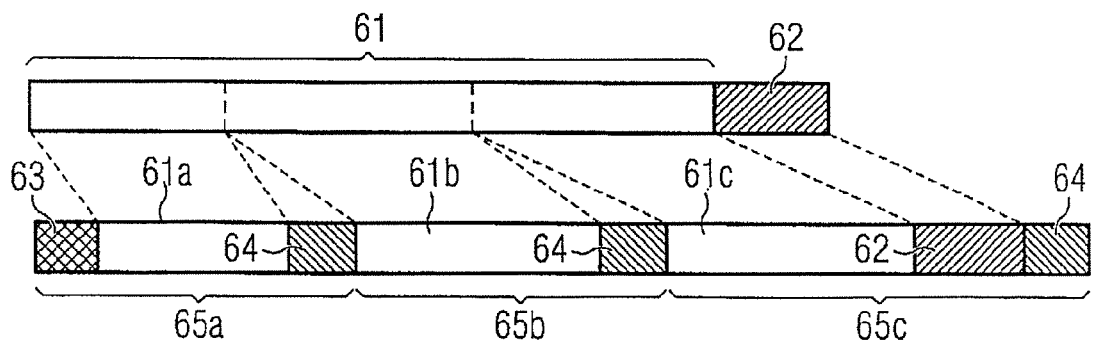
FIG. 6 schematically illustrates a data frame with CRC check data according to the LTE standard.

FIG. 6 schematically illustrates how CRC checks may be used in the LTE standard (3GPP Technical Specification 36.212). According to this standard, a transport block 61 is delivered from the MAC layer to the physical layer in every transmission time interval. First, a CRC check 62 of type A is added to the transport block 61. The result of this transport block based CRC check is used as an ACK/NACK response to the transmitter. Then the transport block 61 is divided into code blocks 61a, 61b, 61c before they are turbo encoded. To each code block 61a, 61b, 61c an additional CRC check 64 of type B are added. Filler bits 63 of predefined values may be added to the beginning of the first code block 61a. In LTE, early termination schemes have been incorporated in the turbo decoders so that the iterative decoding process will stop if the decoded frame is indicated to be good. This may allow to preserve power which may be a scarce resource in a wireless apparatus. If a CRC check is used for early termination or early iteration stopping of the turbo decoding process, it is desirable that the CRC check is operated in parallel to the turbo decoding in order not to degrade the throughput. The CRC check 62 may be used to check transmission of the transport block as a whole, and the CRC checks 64 may be used to check transmission of the code blocks 65a, 65b, 65c. The concept described above in connection with FIGS. 1 to 5 may be applied to one or several of the CRC checks 62, 64.

In addition, while a particular feature or aspect of an embodiment of the invention may have been disclosed with respect to only one of several implementations, such feature or aspect may be combined with one or more other features or aspects of the other implementations as may be desired and advantageous for any given or particular application. Furthermore, to the extent that the terms "include", "have", "with", or other variants thereof are used in either the detailed description or the claims, such terms are intended to be inclusive in a manner similar to the term "comprise". Furthermore, it should be understood that embodiments of the invention may be implemented in discrete circuits, partially integrated circuits or fully integrated circuits or programming means. Also, the term "exemplary" is merely meant as an example, rather than the best or optimal. It is also to be appreciated that features and/or elements depicted herein are illustrated with particular dimensions relative to one another for purposes of simplicity and ease of understanding, and that actual dimensions may differ substantially from that illustrated herein.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. An apparatus, comprising:
a division unit configured to receive a data stream and divide the received data stream into a plurality of data segments; and
a plurality of first cycle redundancy check (CRC) check units, wherein each of the first CRC check units is configured to perform a first CRC check of a respective one of the plurality of data segments, the plurality of first CRC checks being performed concurrently, and wherein each of the first CRC check units is configured to perform a second CRC check based on an output of the respective first CRC check unit.

2. The apparatus of claim 1, further comprising a respective multiplication unit arranged downstream of the first CRC check units, respectively.

3. The apparatus of claim 2, further comprising a memory configured to store pre-computed values therein, and configured to provide the pre-computed values to inputs of the multiplication units.

4. The apparatus of claim 3, wherein the respective second CRC check is based on a product of the output of the respective first CRC check unit and the respective pre-computed value.

5. The apparatus of claim 4, wherein each of the data segments contains consecutive data portions that collectively maintain the same order as contained in the data stream.

6. The apparatus of claim 5, wherein each of the pre-computed values corresponds to a respective one of the data segments and is computed using a position of the respective segment of data in the data stream.

7. The apparatus of claim 1, wherein each of the first CRC check units outputs a respective result, and further comprising a combining unit configured to combine the results output by the first CRC check units.

8. The apparatus of claim 7, further comprising a second CRC check unit arranged downstream of the combining unit.

9. The apparatus of claim 1, wherein consecutive data elements contained in each of the data segments are separated by M−1 data in the data stream, wherein M is an integer greater than or equal to the number of the first CRC check units.

10. The apparatus of claim 9, wherein M is the number of the first CRC check units and wherein each of M consecutive data elements in the data stream is assigned to a respective one of M data segments.

11. The apparatus of claim 9, wherein M is a power of 2.

12. The apparatus of claim 9, wherein each of the pre-computed values corresponds to a respective one of the segments of data and is computed using the position of the respective data segment in the data stream.

13. The apparatus of claim 1, wherein each of the first CRC check units comprises a linear feedback shift register.

14. A method, comprising:
receiving a data stream;
dividing the received data stream into a plurality of data segments;
performing a first CRC check of each of the data segments concurrently to obtain a plurality of first CRC values using a plurality of first CRC check units, respectively; and
performing a second CRC check based on a respective one of the plurality of first CRC values using the plurality of first CRC check units to obtain a plurality of second CRC values.

15. The method of claim 14, wherein the first CRC check of a respective data segment and the second CRC check based on the first CRC value obtained from the first CRC check of the respective data segment are performed by a single CRC check unit.

16. The method of claim 14, wherein the second CRC check is performed to obtain a plurality of second CRC values.

17. The method of claim 16, further comprising multiplying each of the first CRC check values with a respective one of a plurality of pre-computed values prior to performing the second CRC check.

18. The method of claim 17, wherein each of the data segments contains consecutive data portions that collectively maintain the same order as contained in the data stream.

19. The method of claim 18, wherein each of the pre-computed values corresponds to a respective one of the data segments and is computed using the position of the respective data segment in the data stream.

20. The method of claim 16, further comprising combining the first CRC check values or the second CRC check values.

21. The method of claim 20, further comprising performing a third CRC check on the second CRC check values.

22. The method of claim 14, wherein consecutive data elements contained in each of the data segments are separated by M−1 data in the data stream, wherein M is the number of the first CRC checks.

23. The method of claim 22, wherein each of M consecutive data elements in the data stream is assigned to a respective one of M data segments.

24. An apparatus, comprising:
a division unit configured to receive a data stream comprising data elements and divide the received data stream into M data segments, wherein M is a positive integer; and
M first CRC check units, wherein each of the M first CRC check units is configured to perform a first CRC check of a respective one of the M data segments, the M first CRC checks being performed concurrently, wherein each of M consecutive data elements in the data stream is assigned to a different one of the M data segments and wherein each of the M first CRC check units is configured to perform a second CRC check based on an output of the respective first CRC check unit.

25. An apparatus, comprising:
a division unit configured to receive a data stream comprising data elements; and
M first CRC check units, M being a positive integer,
wherein the division unit assigns each of M consecutive data elements in the data stream comprising a data segment to a different one of the M first CRC check units,
wherein each of the M first CRC check units performs a first CRC check of a respective data segment assigned to it and the first CRC checks are performed concurrently, and
wherein each of the M first CRC check units performs a second CRC check based on an output of the respective first CRC check unit.

26. An apparatus, comprising:
a division unit configured to receive a data stream and divide the received data stream into a plurality of data segments; and
a plurality of branches,
wherein each of the branches is configured to perform a first CRC check of a respective one of the plurality of data segments, the plurality of first CRC checks being performed concurrently,
wherein each branch comprises at least one CRC check unit and at least one multiplication unit, and
wherein a respective CRC check unit for each branch is configured to perform the first CRC check and a second CRC check based on an output of the respective CRC check unit and a respective at least one multiplication unit.

27. An apparatus, comprising:
a division unit configured to receive a data stream and divide the received data stream into a plurality of data segments; and
a plurality of first cycle redundancy check (CRC) check units,
wherein each of the first CRC check units is configured to perform a first CRC check of a respective one of the plurality of data segments, the plurality of first CRC checks being performed concurrently, and
wherein each of the first CRC check units is configured to couple an output of the respective first CRC check unit to an input of the respective first CRC check unit, and
wherein each of the first CRC check units is configured to operate recursively on the basis of the output of the respective first CRC check unit such that each of the first CRC check units are configured to perform the first CRC check and a second CRC check based on a result of a respective first CRC check.

* * * * *